US010373578B2

(12) United States Patent
Zhao

(10) Patent No.: US 10,373,578 B2
(45) Date of Patent: Aug. 6, 2019

(54) GOA DRIVING CIRCUIT

(71) Applicant: Wuhan China Star Optoelectronics Technology Co., Ltd., Wuhan, Hubei (CN)

(72) Inventor: Mang Zhao, Hubei (CN)

(73) Assignee: WUHAN CHINA STAR OPTOELECTRONICS TECHNOLOGY CO., LTD., Wuhan (CN)

( * ) Notice: Subject to any disclaimer, the term of this patent is extended or adjusted under 35 U.S.C. 154(b) by 0 days.

(21) Appl. No.: 15/326,575

(22) PCT Filed: Dec. 29, 2016

(86) PCT No.: PCT/CN2016/112987
§ 371 (c)(1),
(2) Date: Jan. 16, 2017

(87) PCT Pub. No.: WO2018/094817
PCT Pub. Date: May 31, 2018

(65) Prior Publication Data
US 2018/0336858 A1 Nov. 22, 2018

(30) Foreign Application Priority Data
Nov. 28, 2016 (CN) .......................... 2016 1 1061519

(51) Int. Cl.
*G09G 3/36* (2006.01)
*H03K 3/012* (2006.01)
*H03K 3/037* (2006.01)

(52) U.S. Cl.
CPC .......... *G09G 3/3677* (2013.01); *H03K 3/012* (2013.01); *G09G 2310/0286* (2013.01); *G09G 2310/0291* (2013.01); *G09G 2310/0294* (2013.01); *G09G 2330/021* (2013.01); *H03K 3/037* (2013.01)

(58) Field of Classification Search
CPC ....... G09G 3/3266; G09G 3/3677; G09G 3/36
See application file for complete search history.

(56) References Cited

U.S. PATENT DOCUMENTS

2011/0150169 A1 6/2011 Lin et al.
2016/0307533 A1* 10/2016 Cao ...................... G09G 3/3677
(Continued)

FOREIGN PATENT DOCUMENTS

CN 104409054 A 3/2015
CN 105096853 A 11/2015
CN 105355179 A 2/2016
(Continued)

OTHER PUBLICATIONS

International Search Report and Written Opinion for International Application No. PCT/CN2016/112987, dated Dec. 29, 2016.
(Continued)

*Primary Examiner* — Abdul-Samad A Adediran

(57) ABSTRACT

Disclosed is a GOA driving circuit, which includes: an input control module, a latch module, a processing module, and a buffer module. A clock control signal is not used to control the input control module, so that the load for generating the clock control signal and power consumption of the circuit can be effectively reduced.

4 Claims, 6 Drawing Sheets

(56) References Cited

U.S. PATENT DOCUMENTS

| | | | | |
|---|---|---|---|---|
| 2017/0039973 | A1* | 2/2017 | Huang | G09G 3/36 |
| 2017/0084238 | A1* | 3/2017 | Cao | G09G 3/3266 |

FOREIGN PATENT DOCUMENTS

| | | | |
|---|---|---|---|
| CN | 105702223 | A | 6/2016 |
| CN | 106057131 | A | 10/2016 |
| CN | 106098015 | A | 11/2016 |
| CN | 106409261 | A | 2/2017 |
| CN | 106782358 | A | 5/2017 |

OTHER PUBLICATIONS

Chinese Office Action and Search Report for Chinese Patent Application No. 201611069140.X, dated Aug. 2, 2018.

* cited by examiner

GOA DRIVING CIRCUIT

CROSS-REFERENCE TO RELATED APPLICATIONS

The present application claims the priority of Chinese patent application CN 201611061519.6, entitled "GOA Driving Circuit" and filed on Nov. 28, 2016, the entirety of which is incorporated herein by reference.

FIELD OF THE INVENTION

The present disclosure relates to the technical field of display control, and in particular, to a GOA driving circuit.

BACKGROUND OF THE INVENTION

GOA (Gate Driver on Array, row scanning integrated on an array substrate) is a technology that forms a row scanning driving signal circuit on an array substrate in a manufacturing procedure of an existing thin film transistor liquid crystal display array, so as to realize progressive scanning driving.

During designing of a conventional GMOS GOA circuit, a clock control signal used therein is not optimized. Consequently, a load and power consumption of a circuit used for generating a clock signal are relatively large, and it is difficult to reduce power consumption of an entire GOA circuit.

SUMMARY OF THE INVENTION

The present disclosure provides a GOA driving circuit, in which a clock control signal is not used to control an input control module, and thus a load for generating the clock control signal and power consumption of the circuit can be effectively reduced.

According to an embodiment of the present disclosure, a GOA driving circuit is provided. The GOA driving circuit comprises:

an input control module, configured to input a cascade signal;

a latch module, configured to latch an input cascade signal;

a processing module, configured to process a cascade signal output by the latch module into a first intermediate signal; and a buffer module, configured to buffer and process the first intermediate signal into a gate driving signal and a second intermediate signal, wherein a phase of the first to intermediate signal is opposite to that of the second intermediate signal, wherein the input control module inputs the cascade signal, and the latch module latches the cascade signal input by the input control module under control of the first intermediate signal and/or the second intermediate signal output by a previous-stage GOA driving circuit and a next-stage GOA driving circuit.

According to an embodiment of the present disclosure, the input control module comprises:

a first transistor, which is a P type transistor, a gate of which is configured to input the first intermediate signal output by the next-stage GOA driving circuit, a source of which is configured to input a first control signal, and a drain of which is connected to the latch module; and a second transistor, which is an N type transistor, a gate of which is configured to input the second intermediate signal output by the previous-stage GOA driving circuit, a source of which is configured to input a second control signal, and a drain of which is connected to the latch module.

According to an embodiment of the present disclosure, the latch module comprises:

a first phase inverter, an input end of which is connected to the drains of the first transistor and the second transistor, and an output end of which is connected to the processing module;

a third transistor, which is a P type transistor, a gate of which is configured to input the second intermediate signal output by the previous-stage GOA driving circuit, and a drain of which is connected to the input end of the first phase inverter;

a fourth transistor, which is an N type transistor, a gate of which is configured to input the first intermediate signal output by the next-stage GOA driving circuit, and a drain of which is connected to a source of the third transistor; and a second phase inverter, an input end of which is connected to the output end of the first phase inverter, and an output end of which is connected to a source of the fourth transistor.

According to an embodiment of the present disclosure, the input control module comprises:

a first transistor, which is a P type transistor, a gate of which is configured to input the first intermediate signal output by the previous-stage GOA driving circuit, a source of which is configured to input a first control signal, and a drain of which is connected to the latch module; and a second transistor, which is an N type transistor, a gate of which is configured to input the second intermediate signal output by the next-stage GOA driving circuit, a source of which is configured to input a second control signal, and a drain of which is connected to the latch module.

According to an embodiment of the present disclosure, the latch module comprises:

a first phase inverter, an input end of which is connected to the drains of the first transistor and the second transistor;

a second phase inverter, an input end of which is connected to an output end of the first phase inverter, and an output end of which is connected to the processing module;

a third transistor, which is an N type transistor, a gate of which is configured to input the first intermediate signal output by the previous-stage GOA driving circuit, and a drain of which is connected to the input end of the first phase inverter; and a fourth transistor, which is a P type transistor, a gate of which is configured to input the second intermediate signal output by the next-stage GOA driving circuit, a drain of which is connected to a source of the third transistor, and a source of which is connected to the output end of the second phase inverter.

According to an embodiment of the present disclosure, the input control module comprises:

a first transistor, which is an N type transistor, a gate of which is configured to input the second intermediate signal output by the previous-stage GOA driving circuit, a source of which is configured to input a second control signal, and a drain of which is connected to the latch module; and a second transistor, which is an N type transistor, a gate of which is configured to input the second intermediate signal output by the next-stage GOA driving circuit, a source of which is configured to input a second control signal, and a drain of which is connected to the latch module.

According to an embodiment of the present disclosure, the latch module comprises:

a first phase inverter, an input end of which is connected to the drain of the first transistor, and an output end of which is connected to the processing module;

a third transistor, which is a P type transistor, a gate of which is configured to input the second intermediate signal output by the previous-stage GOA driving circuit, and a drain of which is connected to the input end of the first phase inverter;

a fourth transistor, which is a P type transistor, a gate of which is configured to input the second intermediate signal output by the next-stage GOA driving circuit, and a source of which is connected to the output end of the first phase inverter; and a second phase inverter, an input end of which is connected to a drain of the fourth transistor, and an output end of which is connected to a source of the third transistor.

According to an embodiment of the present disclosure, the input control module comprises:

a first transistor, which is a P type transistor, a gate of which is configured to input the first intermediate signal output by the next-stage GOA driving circuit, a source of which is configured to input a first control signal, and a drain of which is connected to the latch module; and a second transistor, which is a P type transistor, a gate of which is configured to input the first intermediate signal output by the previous-stage GOA driving circuit, a source of which is configured to input a first control signal, and a drain of which is connected to the latch module.

According to an embodiment of the present disclosure, the latch module comprises:

a first phase inverter, an input end of which is connected to the drain of the first transistor, and an output end of which is connected to the processing module;

a third transistor, which is an N type transistor, a gate of which is configured to input the first intermediate signal output by the next-stage GOA driving circuit, and a drain of which is connected to the input end of the first phase inverter;

a fourth transistor, which is an N type transistor, a gate of which is configured to to input the first intermediate signal output by the previous-stage GOA driving circuit, and a source of which is connected to the output end of the first phase inverter; and a second phase inverter, an input end of which is connected to a drain of the fourth transistor, and an output end of which is connected to a source of the third transistor.

According to an embodiment of the present disclosure, the processing module comprises an NAND gate, a first input end of which is connected to an output end of the latch module, a second input end of which is connected to a first time-sequence driving signal, and an output end of which is connected to the buffer module and outputs the first intermediate signal. The buffer module comprises a third phase inverter, a fourth phase inverter, and a fifth phase inverter that are connected in series.

An input end of the third phase inverter is connected to the processing module, and an output end thereof is connected to an input end of the fourth phase inverter. An output end of the fourth phase inverter is connected to an input end of the fifth phase inverter, and outputs the second intermediate signal. An output end of the fifth phase inverter outputs a gate driving signal. The circuit further comprises a reset module, which comprises a sixth phase inverter and a fifth transistor connected to the sixth phase inverter. An output end of the sixth phase inverter is connected to an output end of the buffer module, and an input end thereof is connected to a drain of the fifth transistor. A source of the fifth transistor is input with a first control signal, and a gate thereof is input with a resetting signal.

The following beneficial effects can be brought about by the present disclosure.

In the GOA driving circuit provided by the present disclosure, a clock control signal is not used to control an input control module, and thus a load for generating the clock control signal and power consumption of the circuit can be effectively reduced.

Other advantages, objectives, and features of the present disclosure will be explained in the following description, and partly become self-evident to a person skilled in the art on the basis of the following study, or can be taught in practice of the present disclosure. The objectives and other advantages of the present disclosure will to be achieved through the structure specifically pointed out in the description, claims, and the accompanying drawings.

BRIEF DESCRIPTION OF THE DRAWINGS

The drawings are provided for further understanding of the technical solution or prior art of the present disclosure, and constitute one part of the description. The drawings that express embodiments of the present application serve to explain the technical solution of the present application in conjunction with the embodiments of the present application, rather than to limit the technical solution of the present application.

DETAILED DESCRIPTION OF THE EMBODIMENTS

The present disclosure will be explained in details with reference to the embodiments and the accompanying drawings, whereby it can be fully understood how to solve the technical problem by the technical means according to the present disclosure and achieve the technical effects thereof, and thus the technical solution according to the present disclosure can be implemented. It should be noted that, as long as there is no structural conflict, all the technical features mentioned in all the embodiments may be combined together in any manner, and the technical solutions obtained in this manner all fall within the scope of the present disclosure.

Figure 1:
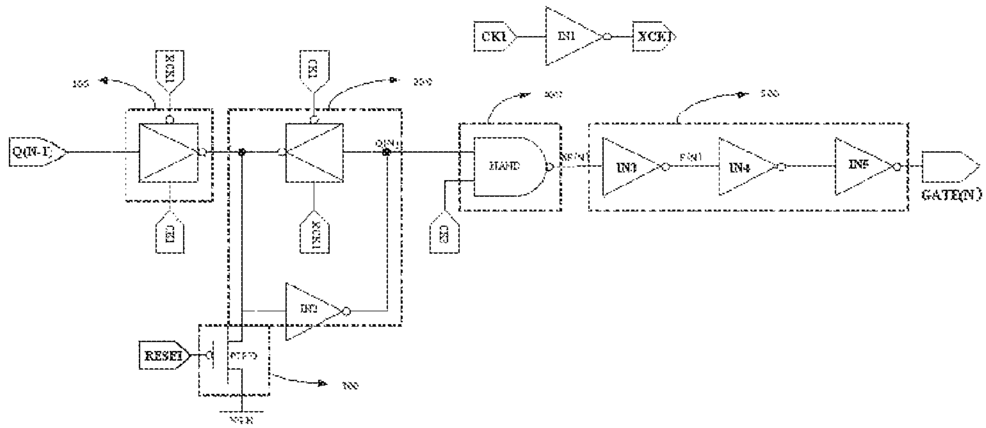
FIG. 1 is a schematic diagram of a GOA driving circuit in the prior art.

FIG. 1 shows a conventional CMOS GOA driving circuit in the prior art. In the circuit, an interlace driving manner is used. A single-edge GOA driving circuit needs two clock control signal CK wirings (for example, a clock control signal CK1 wiring and a clock control signal CK2 wiring), a starting signal STV wiring (not shown in FIG. 1), a resetting signal RESET wiring, a high level signal VGH wiring, and a low level signal VGL wiring. As shown in FIG. 1, the CMOS GOA driving circuit mainly comprises following parts.

An input control module 100 is configured to control a signal that is input to the GOA driving circuit, and control a clock control phase inverter therein by a CK1 signal and an XCK1 signal so as to realize transmission of a signal of point Q in a previous-stage circuit. A latch module 200 controls the clock control phase inverter therein to realize latch of a signal of point Q in a present-stage circuit. A RESET module 300 comprises a transistor PTFT1 and a phase inverter IN2, and is configured to reset signals of nodes in the circuit A point Q signal processing module 400 (an NAND gate) is configured to generate a present-stage gate driving signal by means of NAND processing of a CK3 signal and the point Q signal. A gate driving signal buffering processing module 50X) comprises three phase inverters IN3, IN4, and IN5 that are connected in series, and is configured to improve a driving capability of the gate driving signal. Q(N) in FIG. 1 represents a signal of point Q in an $N^{th}$-stage GOA driving circuit, and point Q is used to control output of the gate driving signal. P(N) represents a signal of point P in the $N^{th}$-stage GOA driving circuit, and point P is used to keep stable output of the circuit in a non-functioning period thereof. The CK1 signal is inverted into the XCK1 signal by the phase inverter IN1. Q(N−1) is a cascade signal of an $N^{th}$-stage GOA driving circuit.

Figure 2A:
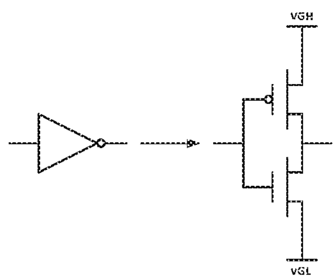
FIGS. 2$a$-2$c$ are schematic diagrams of inner structures of some components of the circuit as shown in FIG. 1.
Figure 2B:
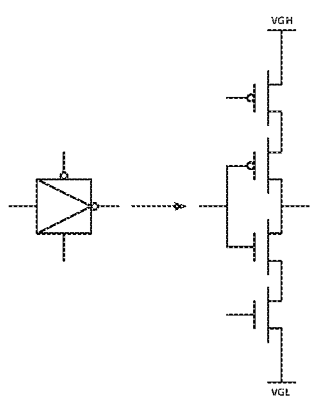
Figure 2C:
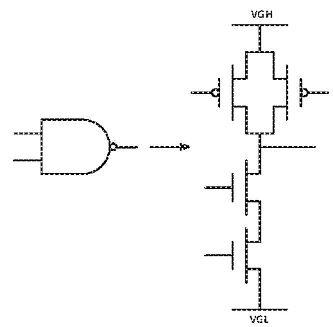

FIGS. 2*a*-2*c* are equivalent circuit diagrams of some components in the CMOS GOA driving circuit as shown in FIG. 1, wherein FIG. 2*a* is an equivalent circuit corresponding to each phase inverter in FIG. 1; FIG. 2*b* is an equivalent circuit corresponding to the clock control phase inverter in FIG. 1; and FIG. 2*c* is an equivalent circuit corresponding to the NAND gate in FIG. 1.

Figure 3:
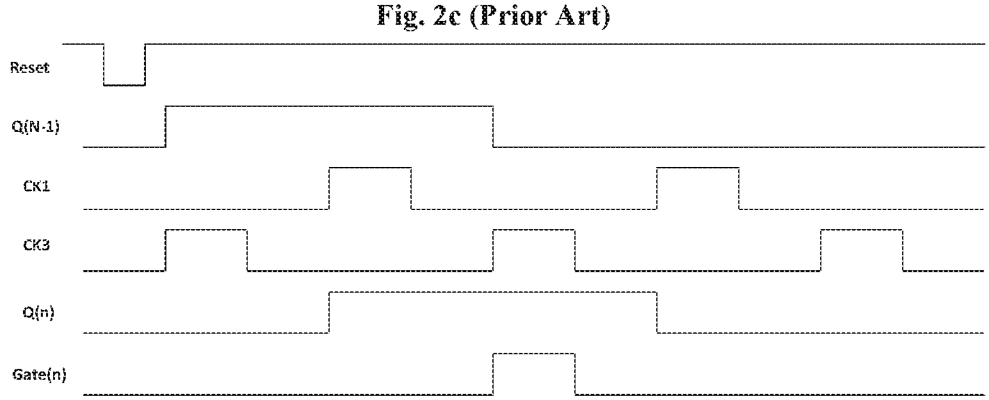
FIG. 3 is a working time sequence diagram during scanning of the circuit as shown FIG. 1.

FIG. 3 is a working time-sequence diagram of the GOA driving circuit as shown in FIG. 1. Based on analysis combining FIG. 3, a working principle of the circuit as shown in FIG. 1 is described as follows: before input of a cascade signal Q(N−1), all GOA driving circuits are reset, points Q of all circuits are reset to a low level, and gate driving signals of all circuits are reset to a low level; when the previous-stage point Q signal and a high level pulse signal of the present-stage input control CK1 signal come at the same time, point Q(N) is charged to a high level; when the input control CK1 signal changes into a low level, the latch module 200 latches a high level signal of point Q(N); when a high level pulse signal that controls the CK3 signal of the NAND gate comes, a GATE(n) signal outputs a high level signal, i.e., GATE(n) generates a present-stage gate driving signal; when the high level pulse signal of the CK1 signal comes again, the point Q(N) is charged to a low level, and subsequently, to point Q(N) latches and inputs a low level signal all the time, and the GATE(N) signal maintains a stable low level output.

According to the above analysis, it can be seen that, in a traditional COMS GOA driving circuit, the input control module 100 needs to be controlled by the CK1 signal. Consequently, a load and power consumption of a circuit used for generating a CK1 signal are relatively large, and it is difficult to reduce power consumption of an entire GOA circuit.

Figure 4:
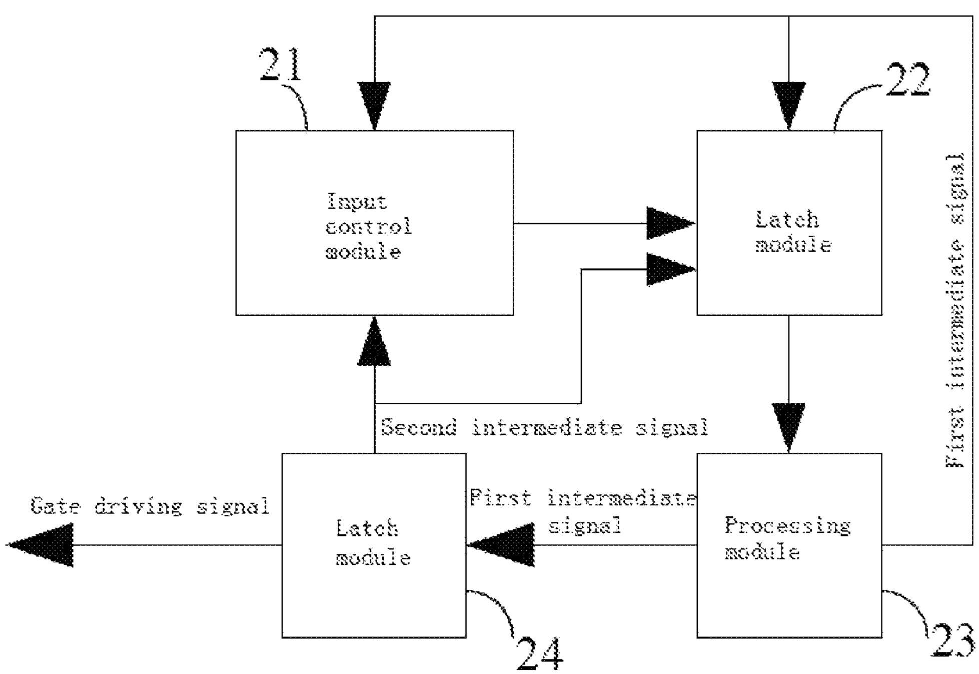
FIG. 4 is a structural diagram of a driving circuit according to one embodiment of the present disclosure.

Therefore, the present disclosure provides a GOA driving circuit, and the input control module 100 thereof does not need to be controlled by a CK1 signal, so that the load for generating the CK1 signal can be effectively reduced and the power consumption of the circuit can be effectively reduced accordingly. FIG. 4 is a schematic diagram of a GOA driving circuit according to one embodiment of the present disclosure. The present disclosure will be illustrated in detail hereinafter with reference to FIG. 4.

The GOA driving circuit comprises an input control module 21, a latch module 22, a processing module 23, and a buffer module 24. The input control module 21 is configured to input a cascade signal; the latch module 22 is configured to latch an input cascade signal; the processing module 23 is configured to process a cascade signal output by the latch module into a first intermediate signal; and the buffer module 24 is configured to buffer and process the first intermediate signal into a gate driving signal and a second intermediate signal, wherein a phase of the first intermediate signal is opposite to that of the second intermediate signal. The input control module 21 inputs the cascade signal, and the latch module 22 latches the cascade signal input by the input control module 21 under control of the first intermediate signal and/or the second intermediate signal output by a previous-stage GOA driving circuit and a next-stage GOA driving circuit.

In the GOA driving circuit provided by the present disclosure, the latch module 22 and the input control module 21 are not controlled by a clock control signal, so that the load for generating the clock control signal and power consumption of the circuit can be effectively reduced.

Figure 5:
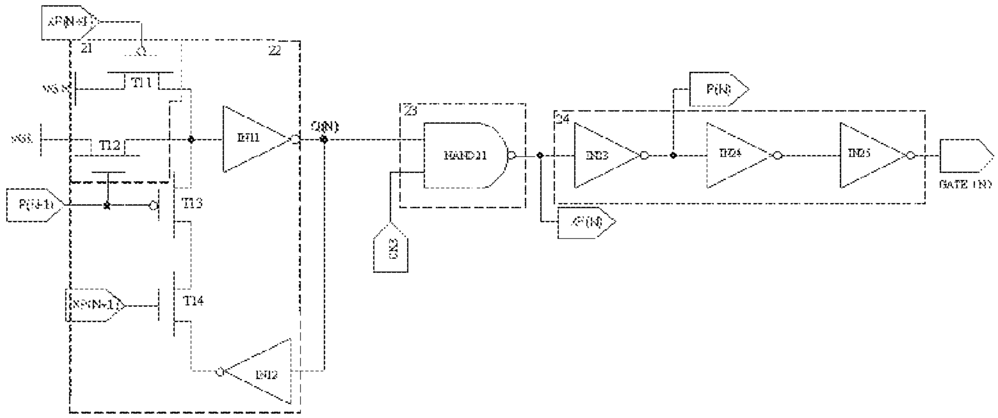
FIG. 5 is a structural diagram of a driving circuit according to a first embodiment of the present disclosure.

According to an embodiment of the present disclosure, the input control module 21 comprises a first transistor T11 and a second transistor T12, as shown in FIG. 5. The first transistor T11 is a P type transistor, a gate of which is configured to input the first intermediate signal XP(N+1) output by the next-stage GOA driving circuit, a source of which is configured to input a first control signal VGH, and a drain of which is connected to the latch module 22. The second transistor T12 is an N type transistor, a gate of which is configured to input the second intermediate signal P(N−1) output by the previous-stage GOA driving circuit, a source of which is configured to input a second control signal VGL, and a drain of which is connected to the latch module 22. In a GOA driving circuit as shown in FIG. 5, a clock control phase inverter module in a conventional CMOS GOA circuit is not used. An input control module is not controlled by a CK1 signal, and a previous-stage first intermediate signal and a next-stage second intermediate signal are used respectively to pull up and pull down an electric potential of point Q in a present-stage circuit.

As shown in FIG. 5, T12, T13, and the P(N−1) signal are used to pull up a present-stage point Q signal, wherein T12 transistor is configured to transmit the point Q signal; T13 transistor is configured to perform switch control on a latch loop; and P(N−1) is a second intermediate signal of a previous-stage GOA circuit, and is configured to perform switch control on T12 and T13 transistors. T11, T14, and the XP(N+1) signal are used to pull down the present-stage point Q signal, wherein the T11 transistor is configured to transmit a low level signal of the point Q signal; the T14 transistor is configured to perform switch control on the latch loop; and XP(N+1) is a first intermediate signal of a next-stage GOA circuit. In the circuit as shown in FIG. 5, a VGH signal is transmitted through a PTFT, and a VGL signal is transmitted through an NTFT, whereby loss of a threshold voltage Vth for transmitting signals can be reduced.

According to an embodiment of the present disclosure, the latch module comprises a first phase inverter IN11, a second phase inverter IN12, a third transistor T13, and a fourth transistor T14, as show in FIG. 5. An input end of the first phase inverter IN11 is connected to the drains of the first transistor T11 and the second transistor T12, and an output end of which is connected to the processing module 23. The third transistor T13 is a P type transistor, a gate of which is configured to input the second intermediate signal P(N−1) output by the previous-stage GOA driving circuit, and a drain of which is connected to the input end of the first phase inverter IN11. The fourth transistor T14 is an N type transistor, a gate of which is configured to input the first intermediate signal XP(N+1) output by the next-stage GOA driving circuit, and a drain of which is connected to a source of the third transistor T13. An input end of the second phase inverter IN12 is connected to the output end of the first phase inverter IN11, and an output end of which is connected to a source of the fourth transistor T14.

Figure 6:
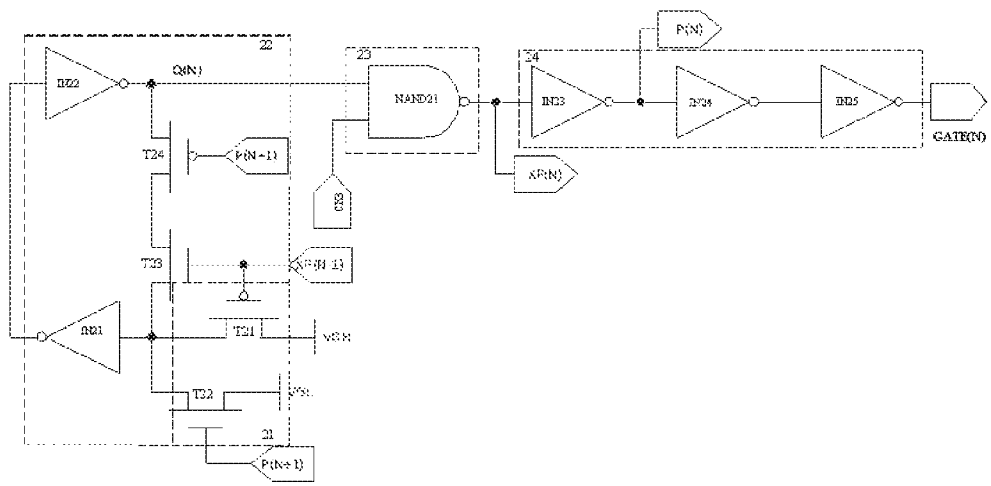
FIG. 6 is a structural diagram of a driving circuit according to a second embodiment of the present disclosure.

According to an embodiment of the present disclosure, the input control module comprises a first transistor T21 and a second transistor T22, as shown in FIG. 6. The first transistor T21 is a P type transistor, a gate of which is configured to input the first intermediate signal XP(N−1) output by the previous-stage GOA driving circuit, a source of which is configured to input a first control signal VGH, and a drain of which is connected to the latch module 22. The second transistor T22 is an N type transistor, a gate of which is configured to input the second intermediate signal P(N+1) output by the next-stage GOA driving circuit, a source of which is configured to input a second control signal VGL, and a drain of which is connected to the latch module 22.

According to an embodiment of the present disclosure, the latch module comprises a first phase inverter IN21, a second phase inverter IN22, a third transistor T23, and a fourth transistor T24, as show in FIG. 6 An input end of the first phase inverter IN21 is connected to the drains of the first transistor T21 and the second transistor T22. An input end of the second phase inverter IN22 is connected to an output end of the first phase inverter IN21, and an output end of which is connected to the processing module 23. The third transistor T23 is an N type transistor, a gate of which is configured to input the first intermediate signal XP(N−1) output by the previous-stage GOA driving circuit, and a drain of which is connected to the input end of the first phase inverter IN21. The fourth transistor T24 a P type transistor, a gate of which is configured to input the second intermediate signal P(N+1) output by the next-stage GOA driving circuit, a drain of which is connected to a source of the third transistor T23, and a source of which is connected to the output end of the second phase inverter IN22.

According to FIG. 5 and FIG. 6, it can be seen that, the third transistor and the fourth transistor are used to perform switch control on the latch loop in the latch module. As shown in FIG. 5, the latch loop is formed by a first phase inverter IN11, a second phase inverter IN12, a third transistor T13, and a fourth transistor T14. After a cascade signal reaches the latch module through the first transistor T11 or the second transistor T12, the second intermediate signal P(N−1) output by the previous-stage GOA driving circuit is in a low level, and the first intermediate signal XP(N+1) output by the next-stage GOA driving circuit is in a high level. At this time, the third transistor T13 and the fourth transistor T14 are turned on, and the cascade signal is stored in the latch loop. As shown in FIG. 6, the latch loop is formed by a first phase inverter IN21, a second phase inverter IN22, a third transistor T23, and a fourth transistor T24. After a cascade signal reaches the latch module through the first transistor T21 or the second transistor T22, the first intermediate signal XP(N−1) output by the previous-stage GOA driving circuit is a high level, and the second intermediate signal P(N+1) output by the next-stage GOA driving circuit is a low level. At this time, the third transistor T23 and the fourth transistor T24 are turned on, and the cascade signal is stored in the latch loop. In the present disclosure, the latch module is not controlled by a clock control signal, so that the load for generating the clock control signal and power consumption of the circuit can be effectively reduced.

Figure 7:
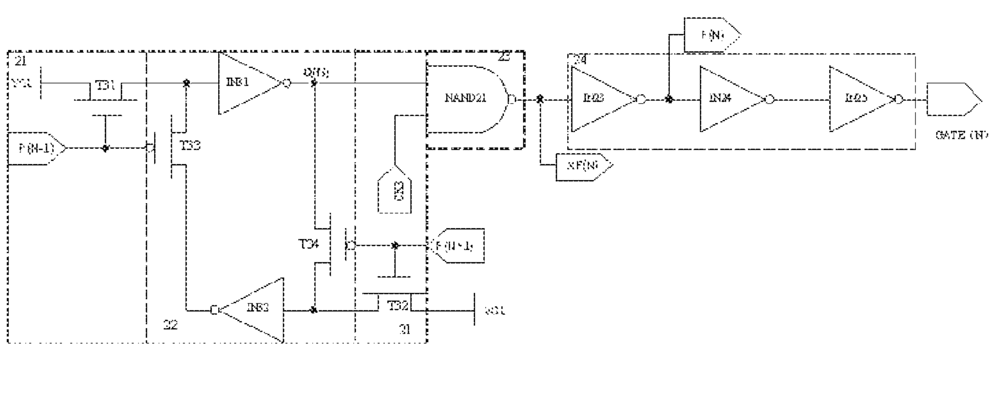
FIG. 7 is a structural diagram of a driving circuit according to a third embodiment of the present disclosure.

According to an embodiment of the present disclosure, the input control module comprises a first transistor T31 and a second transistor T32, as shown in FIG. 7. The first transistor T31 is an N type transistor, a gate of which is configured to input the second intermediate signal P((N−1) output by the previous-stage GOA driving circuit, a source of which is configured to input a second control signal VGL, and a drain of which is connected to the latch module 22. The second transistor T32 is an N type transistor, a gate of which is configured to input the second intermediate signal P((N+1) output by the next-stage GOA driving circuit, a source of which is configured to input a second control signal VGL, and a drain of which is connected to the latch module 22.

According to an embodiment of the present disclosure, the latch module comprises a first phase inverter IN31, a second phase inverter IN32, a third transistor to T33, and a fourth transistor T34, as show in FIG. 7. An input end of the first phase inverter IN31 is connected to the drain of the first transistor T31, and an output end of the first phase inverter IN31 is connected to the processing module. The third transistor T33 is a P type transistor, a gate of which is configured to input the second intermediate signal P(N−1) output by the previous-level GOA driving circuit, and a drain of which is connected to the input end of the first phase inverter IN31. The fourth transistor T34 is a P type transistor, a gate of which is configured to input the second intermediate signal P(N+1) output by the next-level GOA driving circuit, and a source of which is connected to the output end of the first phase inverter IN31. An output end of the second phase inverter IN32 is connected to a source of the third transistor T33, and an input end of the second phase inverter IN32 is connected to a drain of the fourth transistor T34.

As shown in FIG. 7, T32, T34, and a P(N+1) signal are used to pull down a present-stage point Q signal. The T32 transistor is configured to transmit the point Q signal; the T34 transistor is configured to perform switch control on a latch loop; and P(N+1) is a second intermediate signal of a next-stage GOA circuit, and is configured to perform switch control on the T32 and T34 transistors. T31, T33, and a P(N−1) signal are used to pull down a present-stage point Q signal. The T31 transistor is configured to transmit a low level signal of the point Q signal, and the T33 transistor is configured to perform switch control on a latch loop. In the circuit as shown in FIG. 7, a VGL signal is transmitted through an NTFT, so that loss of a threshold voltage Vth for transmitting signals can be reduced.

Figure 8:
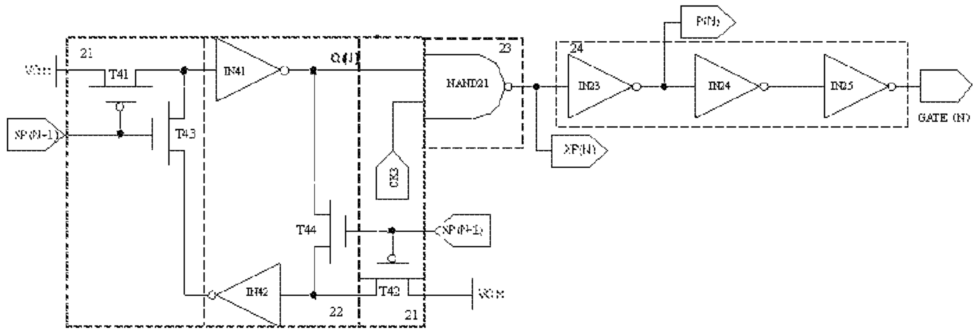
FIG. 8 is a structural diagram of a driving circuit according to a fourth embodiment of the present disclosure.

According to an embodiment of the present disclosure, the input control module comprises a first transistor T41 and a second transistor T42, as shown in FIG. 8. The first transistor T41 is a P type transistor, a gate of which is configured to input the first intermediate signal XP(N+1) output by the next-stage GOA driving circuit, a source of which is configured to input a first control signal VGH, and a drain of which is connected to the latch module 22. The second transistor T42 is a P type transistor, a gate of which is configured to input the first intermediate signal P(N−1) output by the previous-stage GOA driving circuit, a source of which is configured to input a first control signal VGH, and a drain of which is connected to the latch module 22.

According to an embodiment of the present disclosure, the latch module comprises a first phase inverter IN41, a second phase inverter IN42, a third transistor T43, and a fourth transistor T44, as show in FIG. 8. An input end of the first phase inverter IN41 is connected to the drain of the first transistor T41, and an output end of the first phase inverter IN41 is connected to the processing module 23. The third transistor T43 is an N type transistor, a gate of which is configured to input the first intermediate signal XP(N+1) output by the next-stage GOA driving circuit, and a drain of which is connected to the input end of the first phase inverter IN41. The fourth transistor T44 is an N type transistor, a gate of which is configured to input the first intermediate signal XP(N−1) output by the previous-stage GOA driving circuit, and a source of which is connected to the output end of the first phase inverter IN41. An input end of the second phase inverter IN42 is connected to a drain of the fourth transistor T44, and an output end of the second phase inverter IN42 is connected to a source of the third transistor T43.

According to FIG. 7 and FIG. 8, it can be seen that, the third transistor and the fourth transistor are used to perform switch control on the latch loop in the latch module. As shown in FIG. 7, the latch loop is formed by a first phase inverter IN31, a second phase inverter IN32, a third transistor T33, and a fourth transistor T34. After a cascade signal reaches the latch module through the first transistor T31 or the second transistor T32, the second intermediate signal P(N−1) output by the previous-stage GOA driving circuit is in a low level, and the second intermediate signal P(N+1) output by the next-stage GOA driving circuit is in a low level. At this time, the third transistor T33 and the fourth transistor T34 are turned on, and the cascade signal is stored in the latch loop. As shown in FIG. 8, the latch loop is formed by a first phase inverter IN41, a second phase inverter IN42, a third transistor T43, and a fourth transistor T44. After a cascade signal reaches the latch module through the first transistor T41 or the second transistor T42, the first intermediate signal XP(N−1) output by the previous-stage GOA driving circuit is in a high level, and the first intermediate signal XP(N+1) output by the next-stage GOA driving circuit is in a low level. At this time, the third transistor T43 and the fourth transistor T44 are turned on, and the cascaded signal is stored in the latch loop. In the present disclosure, the latch module is not controlled by a clock control signal, so that the load for generating the clock control signal and power consumption of the circuit can be effectively reduced.

According to an embodiment of the present disclosure, the processing module 23 comprises an NAND gate, a first input end of which is connected to an output end of the latch module, a second input end of which is connected to a first time-sequence driving signal CK3, and an output end of which is connected to a buffer module and outputs a present-stage first intermediate signal P(N), as shown in FIG. 5 to FIG. 8.

According to an embodiment of the present disclosure, the buffer module 24 comprises a third phase inverter IN23, a fourth phase inverter IN24, and a fifth phase inverter IN25 that are connected in series. An input end of the third phase inverter IN23 is connected to the processing module, and an output end of the third phase inverter IN23 is connected to an input end of the fourth phase inverter IN24. An output end of the fourth phase inverter IN24 is connected to an input end of the fifth phase inverter IN25, and outputs the second intermediate signal. An output end of the fifth phase inverter IN25 outputs a gate driving signal, as shown in FIG. 5 to FIG. 8.

According to an embodiment of the present disclosure, the circuit further comprises a reset module, which comprises a sixth phase inverter IN26 and a fifth transistor T25 connected to the sixth phase inverter IN26. An output end of the sixth phase inverter IN26 is connected to an output end of the buffer module, and an input end of the sixth phase inverter IN26 is connected to a drain of the fifth transistor T25. A source of the fifth transistor T25 is input with a first control signal, and a gate of the fifth transistor T25 is input with a resetting signal.

Figure 9:
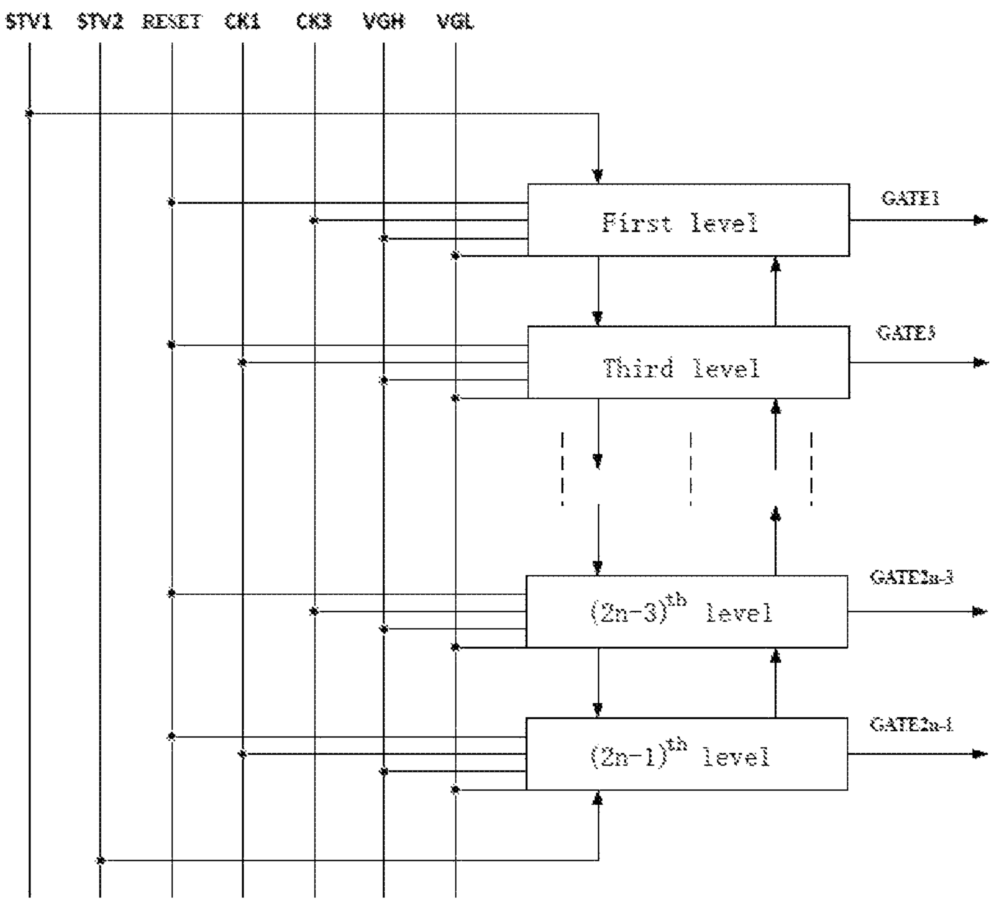
FIG. 9 is a schematic diagram of a driving architecture according to one embodiment of the present disclosure.

FIG. 9 is a diagram of a driving architecture of the circuits as shown in FIG. 5 to FIG. 8. The driving architecture diagram is a single-edge driving architecture diagram, and corresponds to scanning lines in odd-numbered rows. A single-edge GOA circuit needs two STV signal wirings, which are respectively used to pull up an electric potential of a point Q in a first-stage GOA circuit and pull down an electric potential of a point Q in a last-stage GOA circuit. A single edge GOA circuit needs two CK signal wirings which are configured to generate a gate shift driving signal. A single edge GOA circuit needs one RESET wiring which is configured to perform resetting processing on each-stage GOA circuit. A single edge GOA circuit needs one VGH wiring and one VGL wiring for driving the CMOS GOA circuit.

Figure 10:
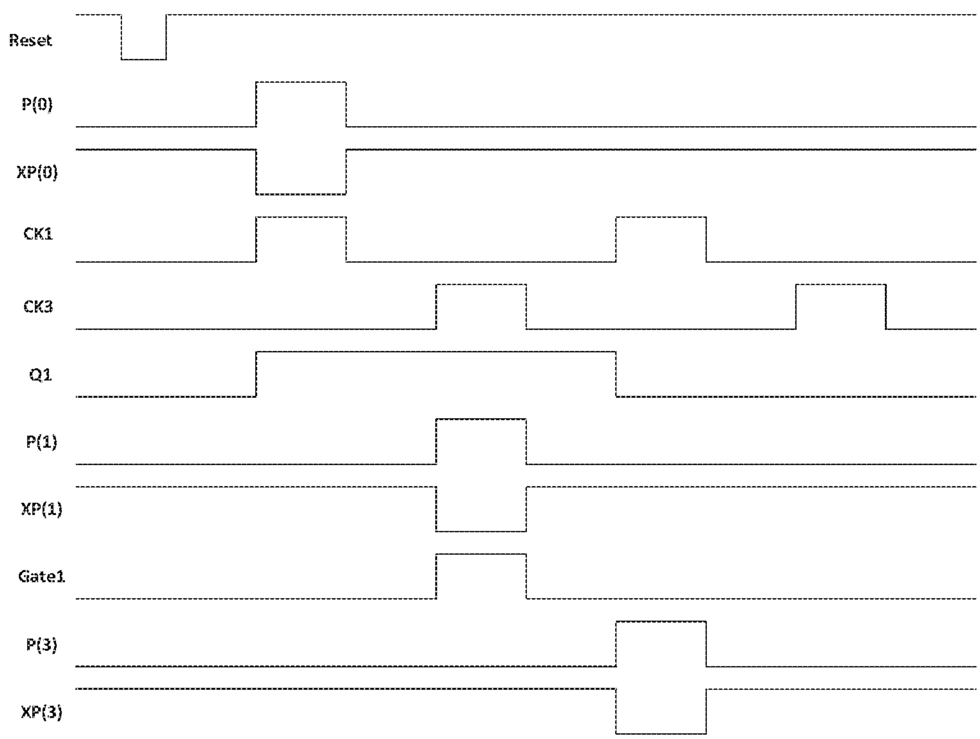
FIG. 10 is a working time sequence diagram during scanning of a driving circuit according to one embodiment of the present disclosure.

FIG. 10 is a scanning driving time-sequence diagram of the driving architecture as shown in FIG. 9. Based on analysis combining the time-sequence diagram, a working principle of the GOA circuit provided by the present application is described as follows: when a low level pulse signal of a RESET signal comes, all GOA circuits are reset, and low level signals are latched after a point Q is reset; when an XP0 low level pulse or a P0 high level pulse signal comes, the point Q is charged to a high level, and subsequently latches a high level signal, when a high level pulse of a CK3 signal comes, a present-stage first intermediate signal XP1 is generated; the present-stage first intermediate signal XP1 is processed into the present-stage gate driving signal GATE1 by the buffer module; and when a low level pulse of XP2 or a high level pulse signal of P2 comes, the point Q is charged to a low level, and subsequently, the point Q latches the low level signal all the time, and the GOA circuit stably outputs a low level gate driving signal.

Figure 11:
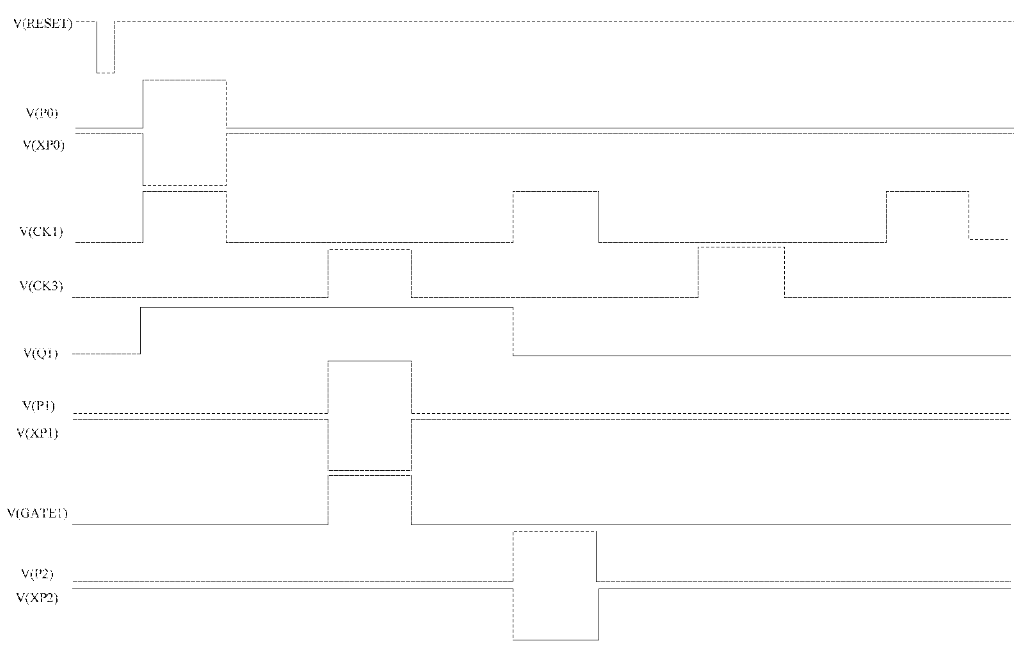
FIG. 11 is a simulation waveform time sequence diagram during scanning of a circuit according to one embodiment of the present disclosure.
Figure 12:
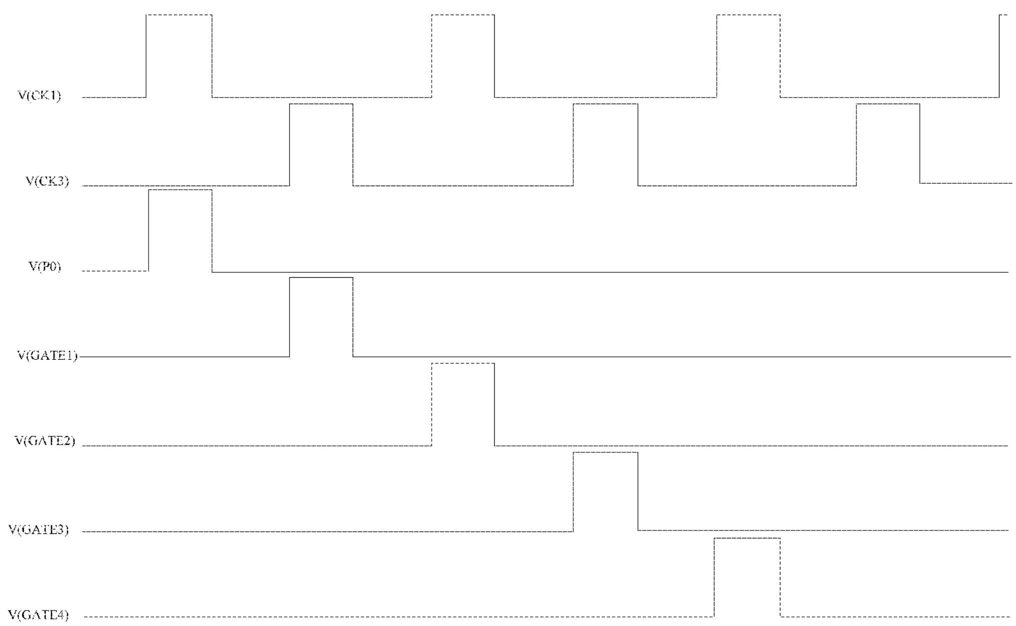
FIG. 12 is a simulation waveform time sequence diagram during scanning of a circuit according to another embodiment of the present disclosure.

FIG. 11 is a first scanning driving simulation schematic diagram according to an embodiment of the present disclosure. FIG. 12 is a second scanning driving simulation schematic diagram according to an embodiment of the present disclosure. According to FIG. 11 and FIG. 12, it can be seen that, in the circuit of the present disclosure, output of a scanning signal in a forward or reverse direction can be realized.

The above embodiments are described only for better understanding, rather than restricting, the present disclosure. Any person skilled in the art can make amendments to the implementing forms or details without departing from the spirit and scope of the present disclosure. The protection scope of the present disclosure shall be determined by the scope as defined in the claims.

The invention claimed is:

1. A gate driver on array (GOA) driving circuit, comprising:

an input control module, configured to input a cascade signal;

a latch module, connected with the input control module and configured to latch the cascade signal input by the input control module;

a processing module, connected with the latch module and configured to process the cascade signal output by the latch module into a first intermediate signal; and a buffer module, connected with the processing module and configured to buffer and process the first intermediate signal into a gate driving signal and a second intermediate signal, wherein a phase of the first intermediate signal is opposite to a phase of the second intermediate signal;

wherein the input control module inputs the cascade signal, and the latch module latches the cascade signal input by the input control module under control of the intermediate signal output by a previous-stage GOA driving circuit or a next-stage GOA driving circuit and the second intermediate signal output by a next-stage GOA driving circuit or a previous-stage GOA driving circuit, or wherein the input control module inputs the cascade signal, and the latch module latches the cascade signal input by the input control module under control of the first intermediate signal and the second intermediate signal output by a previous-stage GOA driving circuit and a next-stage GOA driving circuit; and wherein the processing module comprises a NAND gate, a first input end of which is connected to an output end of the latch module, a second input end of which is connected to a first time-sequence driving signal, and an output end of which is connected to the buffer module and outputs the first intermediate signal;

wherein the buffer module comprises a third phase inverter, a fourth phase inverter, and a fifth phase inverter that are connected in series, wherein an input end of the third phase inverter is connected to the processing module, and an output end of the third phase inverter is connected to an input end of the fourth phase inverter;

wherein an output end of the fourth phase inverter is connected to an input end of the fifth phase inverter, and outputs the second intermediate signal; and wherein an output end of the fifth phase inverter outputs a gate driving signal;

wherein the input control module comprises:

a first transistor, which is a P type transistor, a gate of which is configured to input the first intermediate signal output by the next-stage GOA driving circuit, a source of which is configured to input a first control signal, and a drain of which is connected to the latch module; and a second transistor, which is an N type transistor, a gate of which is configured to input the second intermediate signal output by the previous-stage GOA driving circuit, a source of which is configured to input a second control signal, and a drain of which is connected to the latch module;

wherein the latch module comprises:

a first phase inverter, an input end of which is connected to the drains of the first transistor and the second transistor, and an output end of which is connected to the processing module;

a third transistor, which is a P type transistor, a gate of which is configured to input the second intermediate signal output by the previous-stage GOA driving circuit, and a drain of which is connected to the input end of the first phase inverter;

a fourth transistor, which is an N type transistor, a gate of which is configured to input the first intermediate signal output by the next-stage GOA driving circuit, and a drain of which is connected to a source of the third transistor; and a second phase inverter, an input end of which is connected to the output end of the first phase inverter, and an output end of which is connected to a source of the fourth transistor.

2. A date driver on array (GOA) driving circuit, comprising:

an input control module, configured to input a cascade signal;

a latch module, connected with the input control module and configured to latch the cascade signal input by the input control module;

a processing module, connected with the latch module and configured to process the cascade signal output by the latch module into a first intermediate signal; and a buffer module, connected with the processing module and configured to buffer and process the first intermediate signal into a gate driving signal and a second intermediate signal, wherein a phase of the first intermediate signal is opposite to a phase of the second intermediate signal;

wherein the input control module inputs the cascade signal, and the latch module latches the cascade signal input by the input control module under control of the intermediate signal output by a previous-stage GOA driving circuit or a next-stage GOA driving circuit and the second intermediate signal output by a next-stage GOA driving circuit or a previous-stage GOA driving circuit, or wherein the input control module inputs the cascade signal, and the latch module latches the cascade signal input by the input control module under control of the first intermediate signal and the second intermediate signal output by a previous-stage GOA driving circuit and a next-stage GOA driving circuit; and wherein the processing module comprises a NAND gate, a first input end to which is connected to an output end of the latch module, a second input end of which is connected to a first time-sequence driving signal, and an output end of which is connected to the buffer module and outputs the first intermediate signal;

wherein the buffer module comprises a third phase inverter, a fourth phase inverter, and a fifth phase inverter that are connected in series, wherein an input end of the third phase inverter is connected to the processing module, and an output end of the third phase inverter is connected to an input end of the fourth phase inverter;

wherein an output end of the fourth phase inverter is connected to an input end of the fifth phase inverter, and outputs the second intermediate signal; and wherein an output end of the fifth phase inverter outputs a gate driving signal;

wherein the input control module comprises:

a first transistor, which is a P type transistor, a gate of which is configured to input the first intermediate signal output by the previous-stage GOA driving circuit, a source of which is configured to input a first control signal, and a drain of which is to connected to the latch module; and a second transistor, which is an N type transistor, a gate of which is configured to input the second intermediate signal output by the next-stage GOA driving circuit, a source of which is configured to input a second control signal, and a drain of which is connected to the latch module;

wherein the latch module comprises:

a first phase inverter, an input end of which is connected to the drains of the first transistor and the second transistor;

a second phase inverter, an input end of which is connected to an output end of the first phase inverter, and an output end of which is connected to the processing module;

a third transistor, which is an N type transistor, a gate of which is configured to input the first intermediate signal output by the previous-stage GOA driving circuit, and a drain of which is connected to the input end of the first phase inverter; and a fourth transistor, which is a P type transistor, a gate of which is configured to input the second intermediate signal output by the next-stage GOA driving circuit, a drain of which is connected to a source of the third transistor, and a source of which is connected to the output end of the second phase inverter.

3. A gate driver on array (GOA) driving circuit, comprising:

an input control module, configured to input a cascade signal;

a latch module, connected with the input control module and configured to latch the cascade signal input by the input control module;

a processing module, connected with the latch module and configured to process the cascade signal output by the latch module into a first intermediate signal; and a buffer module, connected with the processing module and configured to buffer and process the first intermediate signal into a gate driving signal and a second intermediate signal, wherein a phase of the first intermediate signal is opposite to a phase of the second intermediate signal;

wherein the input control module inputs the cascade signal, and the latch module latches the cascade signal input by the input control module under control of the intermediate signal output by a previous-stage GOA driving circuit or a next-stage GOA driving circuit and the second intermediate signal output by a next-stage GOA driving circuit or a previous-stage GOA driving circuit, or wherein the input control module inputs the cascade signal, and the latch module latches the cascade signal input by the input control module under control of the first intermediate signal and the second intermediate signal output by a previous-stage GOA driving circuit and a next-stage GOA driving circuit; and wherein the processing module comprises a NAND gate, a first input end to which is connected to an output end of the latch module, a second input end of which is connected to a first time-sequence driving signal, and an output end of which is connected to the buffer module and outputs the first intermediate signal;

wherein the buffer module comprises a third phase inverter, a fourth phase inverter, and a fifth phase inverter that are connected in series, wherein an input end of the third phase inverter is connected to the processing module, and an output end of the third phase inverter is connected to an input end of the fourth phase inverter;

wherein an output end of the fourth phase inverter is connected to an input end of the fifth phase inverter, and outputs the second intermediate signal; and wherein an output end of the fifth phase inverter outputs a gate driving signal;

wherein the input control module comprises:

a first transistor, which is an N type transistor, a gate of which is configured to input the second intermediate signal output by the previous-stage GOA driving circuit, a source of which is configured to input a second control signal, and a drain of which is connected to the latch module; and a second transistor, which is an N type transistor, a gate of which is configured to input the second intermediate signal output by the next-stage GOA driving circuit, a source of which is configured to input a second control signal, and a drain of which is connected to the latch module;

wherein the latch module comprises:

a first phase inverter, an input end of which is connected to the drain of the first transistor, and an output end of which is connected to the processing module;

a third transistor, which is a P type transistor, a gate of which is configured to input the second intermediate signal output by the previous-stage GOA driving circuit, and a drain of which is connected to the input end of the first phase inverter;

a fourth transistor, which is a P type transistor, a gate of which is configured to input the second intermediate signal output by the next-stage GOA driving circuit, and a source of which is connected to the output end of the first phase inverter; and a second phase inverter, an input end of which is connected to a drain of the fourth transistor, and an output end of which is connected to a source of the third transistor.

4. A gate driver on array (GOA) driving circuit, comprising:

an input control module, configured to input a cascade signal;

a latch module, connected with the input control module and configured to latch the cascade signal input by the input control module;

a processing module, connected with the latch module and configured to process the cascade signal output by the latch module into a first intermediate signal; and a buffer module, connected with the processing module and configured to buffer and process the first intermediate signal into a gate driving signal and a second intermediate signal, wherein a phase of the first intermediate signal is opposite to a phase of the second intermediate signal;

wherein the input control module inputs the cascade signal, and the latch module latches the cascade signal input by the input control module under control of the intermediate signal output by a previous-stage GOA driving circuit or a next-stage GOA driving circuit and the second intermediate signal output by a next-stage GOA driving circuit or a previous-stage GOA driving circuit, or wherein the input control module inputs the cascade signal, and the latch module latches the cascade signal input by the input control module under control of the first intermediate signal and the second intermediate signal output by a previous-stage GOA driving circuit and a next-stage GOA driving circuit; and wherein the processing module comprises a NAND gate, a first input end of which is connected to an output end of the latch module, a second input end of which is connected to a first time-sequence driving signal, and an output end of which is connected to the buffer module and outputs the first intermediate signal;

wherein the buffer module comprises a third phase inverter, a fourth phase inverter, and a fifth phase inverter that are connected in series, wherein an input end of the third phase inverter is connected to the processing module, and an output end of the third phase inverter is connected to an input end of the fourth phase inverter;

wherein an output end of the fourth phase inverter is connected to an input end of the fifth phase inverter, and outputs the second intermediate signal; and wherein an output end of the fifth phase inverter outputs a gate driving signal;

wherein the input control module comprises:

a first transistor, which is a P type transistor, a gate of which is configured to input the first intermediate signal output by the next-stage GOA driving circuit, a source of which is configured to input a first control signal, and a drain of which is connected to the latch module; and a second transistor, which is a P type transistor, a gate of which is configured to input the first intermediate signal output by the previous-stage GOA driving circuit, a source of which is configured to input a first control signal, and a drain of which is connected to the latch module;

wherein the latch module comprises:

a first phase inverter, an input end of which is connected to the drain of the first transistor, and am output end of which is connected to the processing module;

a third transistor, which is am N type transistor, a gate of which is configured to input the first intermediate signal output by the next-stage GOA driving circuit, and a drain of which is connected to the input end of the first phase inverter;

a fourth transistor, which is an N type transistor, a gate of which is configured to input the first intermediate signal output by the previous-stage GOA driving circuit, and a source of which is connected to the output end of the first phase inverter; and a second phase inverter, an input end of which is connected to a drain of the fourth transistor, and an output end of which is connected to a source of the third transistor.

* * * * *